(12) United States Patent
De La Cruz et al.

(10) Patent No.: US 7,403,136 B2
(45) Date of Patent: Jul. 22, 2008

(54) BLOCK DATA COMPRESSION SYSTEM, COMPRISING A COMPRESSION DEVICE AND A DECOMPRESSION DEVICE AND METHOD FOR RAPID BLOCK DATA COMPRESSION WITH MULTI-BYTE SEARCH

(75) Inventors: Alfredo De La Cruz, Chemnitz (DE); Claus Dittrich, Chemnitz (DE); Thomas Reichert, Chemnitz (DE)

(73) Assignee: Gemac-Gesellschaft fuer Mikroelektronikan Wendung Chemnitz mbH, Chemnitz (DE)

( * ) Notice: Subject to any disclaimer, the term of this patent is extended or adjusted under 35 U.S.C. 154(b) by 532 days.

(21) Appl. No.: 11/184,673

(22) PCT Filed: Jan. 15, 2004

(86) PCT No.: PCT/DE2004/000039

§ 371 (c)(1), (2), (4) Date: Aug. 31, 2005

(87) PCT Pub. No.: WO2004/066505

PCT Pub. Date: Aug. 5, 2004

(65) Prior Publication Data

US 2007/0150497 A1 Jun. 28, 2007

(30) Foreign Application Priority Data

Jan. 16, 2003 (DE) .............................. 103 01 362

(51) Int. Cl.
*H03M 7/34* (2006.01)

(52) U.S. Cl. ........................................ 341/51; 341/106

(58) Field of Classification Search .................. 341/50, 341/51, 106, 107, 87; 375/E7.093; 710/68
See application file for complete search history.

(56) References Cited

U.S. PATENT DOCUMENTS 5,841,376 A * 11/1998 Hayashi ....................... 341/51
7,167,115 B1 * 1/2007 Mondal et al. ................ 341/87
7,180,433 B1 * 2/2007 Grotmol ....................... 341/51

OTHER PUBLICATIONS

Khalid Sayood, "Introduction to Data Compression", published by Morgan Kaufmann, 1997, pp. 100-113.

* cited by examiner

Primary Examiner—Brian Young
(74) Attorney, Agent, or Firm—Jordan and Hamburg LLP

(57) ABSTRACT

A block data compression system comprising a Compression unit and a Decompression unit, and an Algorithm for fast block data compression using multi-byte search.

Objective of the invention is to develop a block data compression system and algorithm for fast block data compression with multi-byte search for optimal encoding during the learning phase of substitutional methods, allowing length-limited and relative small blocks of input data symbols to be compressed independently, as required by random-access storage or telecommunication devices; and reaching high-performance characteristics by employed accelerating architectures and highly pipelines data-flow principles.

According to the present invention these objectives are accomplished by a Compression Unit comprising an Input-FIFO (8), connected to a Modeling Unit (6), where said Modeling Unit (6) is connected to a multitude of memory locations represented by Trie-Dictionary (4) memory, to a Zero-Finder Look-Up Table (3), to search means in the form of a Comparison Unit (5), to memory means in the form of a Literal-Dictionary (2) and also to an Encoder Unit (7); said Encoder Unit (7) also connected through an Aligning Unit (7) to an Output-FIFO (12).

The invention comprises a block data compression system, composed of a Compression Unit and a Decompression Unit, and an algorithm for fast block data compression using multi-byte search; and is related to the field of data compression, specifically to the implementation of a lossless, adaptive, reversible and fast block data compression for storage and telecommunication devices.

18 Claims, 4 Drawing Sheets

Fig. 2
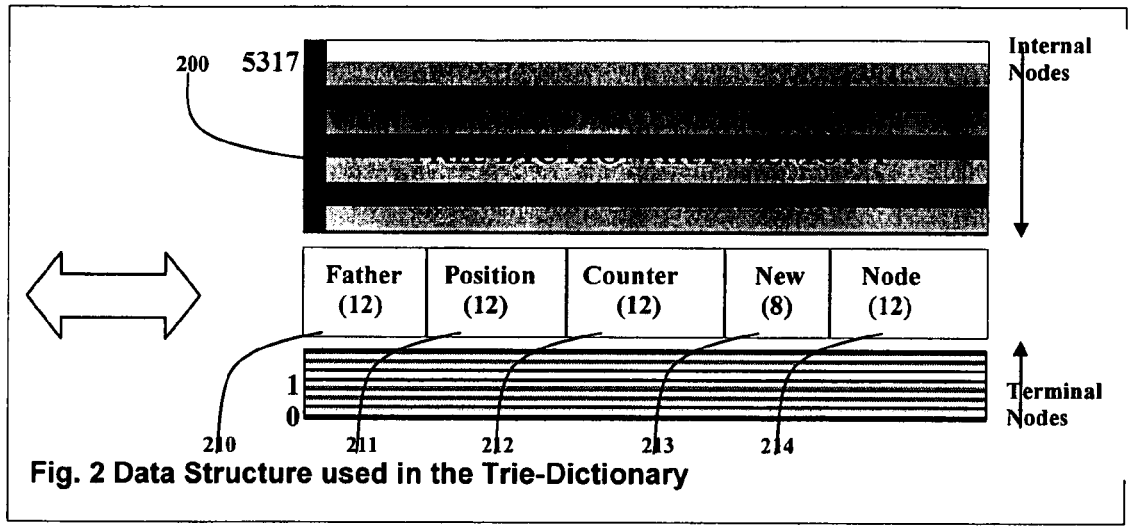
Fig. 2 Data Structure used in the Trie-Dictionary
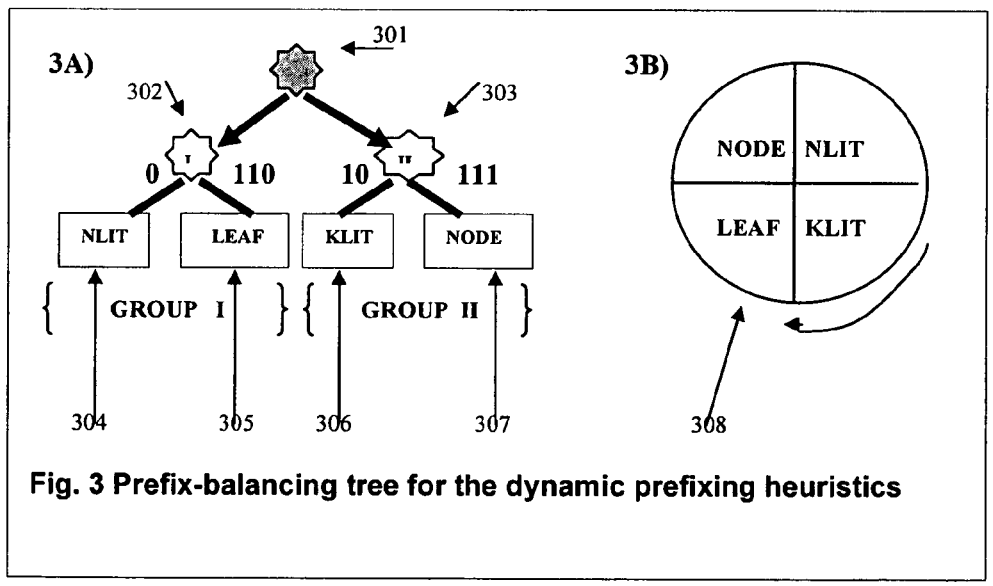
Fig. 3 Prefix-balancing tree for the dynamic prefixing heuristics

Fig. 5

| Position | Sub-String Analyzed | Multi-Symbol Match: | Generated LEAF Node | Generated Internal Node | Prefix Type | Resulting Code-word | Bit-stream in codeword |
|---|---|---|---|---|---|---|---|
| 0 | a,b | -- | I | -- | NLIT | "a" | "0","01100001" |
| 1 | b,c | -- | II | -- | NLIT | "b" | "0","01100010" |
| 2 | c,a | -- | III | -- | NLIT | "c" | "0","01100011" |
| 3 | a,b (b) | 2(mit I) | IV | 1 | LEAF | (-2,2) | "10","1001","0" |
| 5 | b,c (aa) | 3(mit II) | V | 2 | LEAF | (-2,3) | "10","1001","100" |
| 8 | a,c | -- | VI | -- | KLIT | 0 | "110","00" |
| 9 | c,b | -- | VII | -- | KLIT | 2 | "110","10" |
| 10 | b,c(b) | 2 (mit 2) | VIII | 3 | NODE | (2,2) | "111","10","0" |
| 12 | b,c (aacx) | 5 (mit V) | IX | 4 | LEAF | (-3,2) | "10","1001","100" |
| 17 | x | -- | X | -- | NLIT | "x" | "0","01111000" | a b c a b b c a a c  b  c  b   c  a  a   c  x  => (a) (b) (c) (ab) (bca) (a) (c) (bc) (bcaac) (x)
0 1 2 3 4 5 6 7 8 9 10 11 12  13 14 15  16 17

Fig. 6

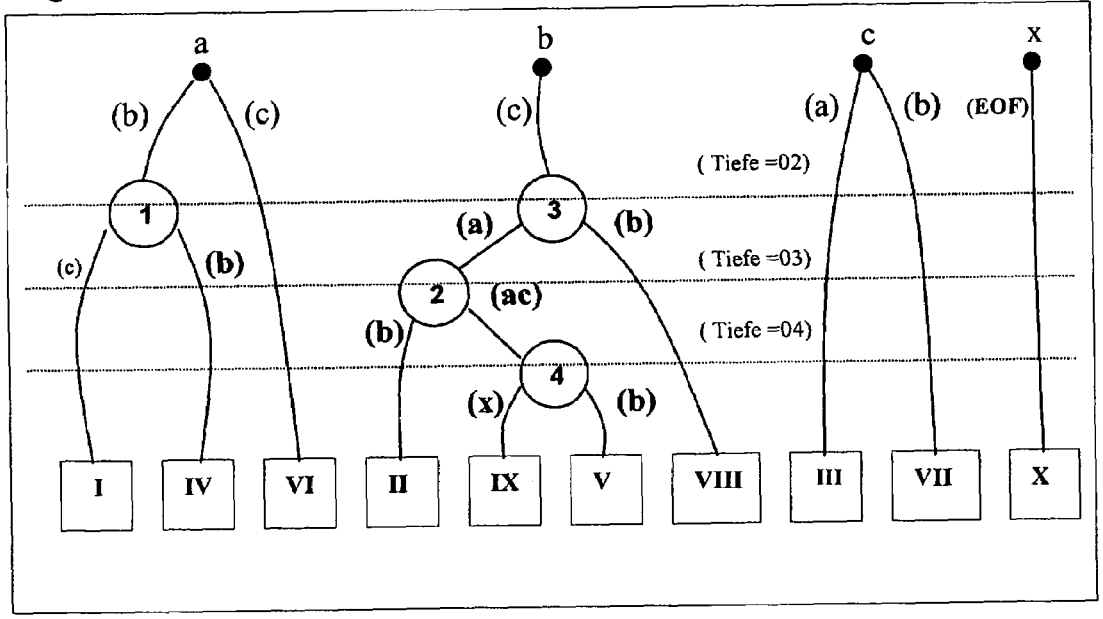

BLOCK DATA COMPRESSION SYSTEM, COMPRISING A COMPRESSION DEVICE AND A DECOMPRESSION DEVICE AND METHOD FOR RAPID BLOCK DATA COMPRESSION WITH MULTI-BYTE SEARCH

FIELD OF THE INVENTION

A block data compression system, composed by a compression apparatus and a decompression apparatus and a procedure for fast block data compression with Multi-byte Searching.

This invention consists in a data compression system, composed by a Compression apparatus and a Decompression apparatus and a data compression algorithm for a fast block-compression with Multi-Byte search, related to the field of data compression, and more particularly, with a lossless adaptive and reversible digital apparatus for fast block data compression in storage and telecommunication devices.

Digital data compression is well-known mean of reducing the space requirements of mass media storage devices. At the same time, the use of data compression achieves to minimize the transmission time of this data through networks, in satellites communications, and similar applications. The accelerate grow of the information processed, transmitted and stored in now-a-days systems impose a challenge to the modern applications, and therefore the importance of data compression.

BACKGROUND OF THE INVENTION

Great efforts had been invested in last years in the development of efficient general purpose data compression algorithms capable to adapt themselves to several types of information, and capable to obtain equivalent results as specific-oriented ones, based on an advanced knowledge of the characteristics of the information. Ideally, systems that accomplish this task should be fast and capable to obtain good compression rates, and from the other side, to have limited complexity.

The works published in the last years have been primarily oriented to fulfill both demands and reaching an optimal compromise. The roots of data compression methods are based on the redundancy existing in most types of data. It is well-established the non-optimality of human-type of communications, as can be seen for example in text files. Methods that first gather the statistics or the lexicographic rules and, after that, accomplish the compression process, are classified as "Off-line methods". A general disadvantage of this principle is the necessity of transmitting additional information referring to these statistics. On the other hand, a method is classified as Adaptive if the compression is accomplished based on the information so-far processed, that in most cases is achieved by an on-line or "one-pass" procedure.

There are many approaches in the prior art for compressing data. D. A. Huffman in "A method for the construction of minimum redundancy codes"; Proceedings of the IRE; Vol. 40; 1952; pp. 1098-1110, proposed a classical algorithm based on assigning variable-length codes to fixed-length symbols (for example bytes) of the input alphabet, based on the statistical probability of the symbols in the context of the whole string or input file.

The next generation of Huffman codes were directed to make the algorithm one-pass and adaptable to the changes in the context. With these modifications the compression was able to take into account the probabilities of the so-far processed symbols to make a decision how to code the next incoming symbol. See D. E. Knuth, "Dynamic Huffman codes"; Journal of Algorithms, Vol. 6, No. 2; June 1985; pp 163-180; J. S. Vittier; "Design and analysis of dynamic Huffman codes"; Journal of the ACM; Vol. 34; No. 4; October 1987; pp. 825-845; and also J. S. Vittier, "Dynamic Huffman coding"; ACM Transaction on Mathematical Software; Vol. 15; No. 2; June 1989; pp. 158-167.

More recently, it have been was discovered a way to avoid the waste of coding derived from coding the fractional entropy [Log $P(X_i)*P(X_i)$] in an integer number of bits. This conducted to the so-called arithmetic coding. The advantages of this type of coding become apparent since its optimality referring to the entropy, is only limited by practical considerations regarding the precision of the arithmetic required. As a rule, the obtained results are very close to the theoretical entropy.

Nevertheless, none of the above first-order methods are able to exploit the correlation, existing in most types of data, from one sub-string to the next character. To illustrated the above statement, let us to consider the case when the letter 'q' is the last symbol processed. For German and English language (among others), the probability having a 'u' as the next incoming letter is quite high, no matter how frequently the symbol 'u' had appeared earlier in the past string, nor if it had appeared at all previously. Due to this fact, the compression ratios reachable by first-order compression algorithms is limited. High-order methods, discussed below, usually obtain higher compression rates. High-order models had been devised for the statistical methods, see for example "Cleary et al; "Unbounded Length Contexts for PPM"; Data Compression Conference(DCC95), 1995", but the increase in performance is conveyed with a substantial decrease in speed and high memory requirements.

Another principle for data compression subject was proposed by J. Ziv and Lempel in 1977 and later in 1978, and had derived to other family of compression algorithms, usually classified as substitutional. The paradigm behind their ideas is the following: to create a Copy codeword that expresses, if possible, the previous (or one of the previous) occurrences of the next incoming sub-string; otherwise the next character is expressed at the output end in its original form, tagged accordingly. Two papers from these authors had generated different approaches around the manner in which the Copy codewords are determined and constructed.

In "A universal algorithm for sequential data compression"; IEEE Transaction on Information Theory; IT-23; No. 3; 1977; pp. 337-343; is disclosed a window approach. In the specialized literature this concept is also known as ZL1, or "sliding dictionary". The identifying characteristic of this algorithm is the concept of a window traveling through the original uncompressed data. In each step the incoming sub-string is searched in the window of the past buffer in order to find if there is sub-string that generates a match. The goal is to identify the longest identical match possible. As a result of the search, a pair <Position, Length> is established, that univocally specify the next incoming sub-string as a match against a sub-string from the past data window. This pair is then encoded and appended to the coded data stream. At the end, the window is then moved forward as to include the newly matched sub-string, discarding, if necessary, the oldest characters in the window as to keep the window size constant. In case that a sub-string at the input is not able to match any previous sub-string within the window of two or more symbols (threshold length), then the incoming character(s) are reflected in the output in its original form, also known as Literal from. Both opposite coding cases are conveniently marked, as to allow the decompression.

Extensive work had been done aimed as establishing better ways to solve the search tasks associated with this algorithm, and a multitude of practical software implementations abound for several operating systems. Enhancements to this approach had been made popular (by the method known as LZSS) by former Stac, reflected in disclosures of U.S. Pat. No. 5,016,009; U.S. Pat. No. 5,126,739; U.S. Pat. No. 5,414, 425; U.S. Pat. No. 5,463,390; U.S. Pat. No. 5,506,580 from D. L. Whiting et al. A discussion around the search strategies and variations on ZL1 can be founded on T. Bell; "Modeling for text compression"; ACM Computer Surveys; Vol. 21; No. 4; December 1989; pp. 557-591. In a fundamental property of this approach, the Position pointer indicates a character-position in the window at which the matched sub-string starts. In the remaining text of this invention, we shall denote this representation of the pointer as "External", for reasons that will become apparent in the disclosure of our invention.

One of the main drawbacks of ZL1 is the slow nature of the search process. In practical implementations, a data structure is constructed additionally to speed-up the search task. This structure normally contains the last N addresses where the individual symbols (that the same time represent the start of a substring) have been found within the window, and will be updated for each incoming symbol by inserting the new address (and eventually by deleting the oldest address in the concrete symbol sub-list). Still, the insertion in the structure of all the sub-strings that start in every external position constitute a consuming procedure and therefore it is required to establish a limit in the maximal Match Length that the search can identify. Besides, for practical reasons, the amount of stored N addresses where the substrings start have to be limited (for example, to the last 3 occurrences); altogether deriving in a non-exhaustive search producing non-optimal results.

To overcome this limitations, a hardware architecture had been proposed in US. Pat. No. 5,612,693, and later enhanced in U.S. Pat. No. 5,627,534; U.S. Pat. No. 5,874,907; U.S. Pat. No. 5,877,711 by Craft, D. J. implying the use of special Content Addressable Memory (CAM) for accomplishing parallel search in a limited-size window, in a method known as ALDC. The exhaustive search reached in this method compensates the reduced window-size (a result of the technological complexity of the CAM memory), and the overall compression rates are reported by the author to be similar to LZSS.

Another philosophy in the substitutional method is exposed in J. Ziv, A. Lempel; "Compression of individual sequences via variable-rate coding"; IEEE Transaction on Information Theory; IT-24, No. 5; September 1978; pp. 530-536. It constitutes the basis for the disclosure of W. L. Eastman, J. Ziv, A. Lempel et al; "Apparatus and methods for compressing data signals and restoring the compressed data"; U.S. Pat. No. 4,464,650, 1984. Further improvements are disclosed in T. Welch U.S. Pat. No. 4,558,302, 1985. We shall refer to the latter since it had been very popular for some time. See also T. Welch "A Technique for High Performance Data Compression"; Computer; Vol. 17; No. 6; June 1984; pp. 8-19 for details.

In Ziv-Lempel-Welch (ZLW), a dynamic dictionary is constructed (and hence the name of Dynamic Dictionary Method, as it is also known) that contains sub-strings of intrinsic variable length. Whenever a match is found for the incoming sub-string with a dictionary element, the incoming substring will be substituted on the output (encoded bit-stream) by the address of the matching dictionary element. The dictionary contains also in the lower addresses all the single symbols of the input alphabet, therefore single not-matching characters (whose matching length is lower than 2) can also be substituted by its corresponding node address and transferred to the output. If by a search in ZLW a sub-string S (initially consisting of 2 characters, and every new search adding a symbol) is found in the dictionary, then the dictionary will be examined again with the pair <S, Next symbol> until a non-match is found, i.e. Until the new pair is not included in the dictionary. At this point, the last address (pointer) of the dictionary is sent out, and the non-matched pair <S,Next symbol> will be inserted to the dictionary into a new address, and hence, the ZLW method can only increment in one symbol an entry in the dictionary per compression step. Finally, the processing of the input string will follow up starting again from the last non-matching symbol. As a consequence, symbol sub-strings included in a Dictionary codeword, will not automatically be included as dictionary substrings themselves (for example: dictionary substring x could contain the symbols 'abcde', but still the substrings 'bcde','cde' and 'de' will not be created). Besides, on the first appearance of a substring the method is not capable to produce an encoding to the output stream with the address of the newer element, but just the previously existing substring. Only on a second appearance of the sub-string will be the new substring effective.

Hashing procedures are useful for this type of compression allowing to keep reasonable the amount of memory used for the dictionary, and increasing the speed in the dictionary-search. Still, ZLW fails to quickly "learn" the characteristics of the input data, as the update of the dictionary is an iterative process, and therefore, there exists a non-zero threshold level after which the method begins to operate efficiently. This implies that in short input files it produces rather disappointing results comparing with competing methods, and in general the compression rates reached are slightly below the results obtained with ZLSS. Others drawbacks appears if the intention is to use it in a continuous flow of input strings when the dictionary fills-up.

In U.S. Pat. No. 4,906,991 "Text substitution data compression with finite length search window" of E. Fiala, et. al. it is developed further a so-called Suffix-Trie disclosed in R. Morrison "Patricia-Practical Algorithm to retrieve information coded in alphanumeric"; Journal of the ACM; Vol. 15; No. 4; 1968; pp. 513-534, and proposed a series of compression algorithms, coming from the "External" representation of ZL1 and getting closer to the "Internal" representation of ZL2. Regrettably, central to its compressor is the fusion of several non-compressible symbols in an unique codeword (with a prefixed symbol-count). That in turn conducts to a high latency time in the output of the algorithm. Further, as a mainly software data compression approach, the Trie constructed requires substantial memory resources which prevented its implementation in hardware solutions.

Later works in the use of Trie structures for creating dynamic dictionaries had been described in U.S. Pat. No. 5,406,279 of Anderson; U.S. Pat. No. 5,640,551 of Chou; and U.S. Pat. No. 6,012,061 of Sharma. However, they had focused on additional techniques for maintaining/updating the Trie dictionary when it becomes full, as a result of processing big enough files as input. None of them had addressed the above mentioned limitations, nor provided the key properties for allowing fast hardware data compression solutions.

SUMMARY OF THE INVENTION

Object of the present invention is to provide a Block-Data compression system, comprising a Compression apparatus and a Decompression apparatus, and a method for fast block data compression with Multi-Byte search for optimal encoding whereas developing a substitutive method for the learning phase, by means of which bounded and relative small input file(s) can be compressed independently each from another, as required by random storage devices or telecommunication devices; and able to reach a high performance by including several architectural accelerating structures and data-flow principles, as for example, highly pipelined behavior.

The object of the present invention will be achieved by a Block Data Compression system, comprising a Compression apparatus and a Decompression apparatus, whereas the Compression Apparatus contains an Input-FIFO for buffering input symbols in a first-in first-out manner, said symbols connected to arbitration means represented by a Modeling Unit connected itself to a Trie-Dictionary, a Zero Look-Up Table, search components in the form of a Comparison Unit, to a memory representing the Literal-Dictionary and with an Encoder Unit. The Encoder Unit is connected, by itself, to an Output-FIFO through an Aligner Unit. Said Trie-Dictionary consists on a multiplicity of storage locations, accessed in parallel form by the Modeling Unit and represents the high-order dictionary addressed via a Hash-function based on the first symbols contained in the Input-FIFO. The Zero Look-Up Table serves for the advanced determination of the existence of a certain unused space in the high-order dictionary, meanwhile the Modeling Unit determines if the string existing in the Input FIFO can be substituted by internal or terminal nodes the Trie-Dictionary. The Comparison Unit executes parallel comparisons of several symbols at once to provide information about the maximal length of matching between the internal node found in the Trie-Dictionary and the string of symbols contained in said Input FIFO. The Literal Dictionary, representing the low-order dictionary, determines the encoded form granted by the Modeling Unit for unmatched strings of length equal to one. The Modeling Unit decides whether it will use the result of the parallel search of the Comparison Unit or the result of the Literal-Dictionary as the compression output. The Modeling Unit also allows to iterate the parallel search in the Comparison Unit when more internal nodes of the dictionary are able to extend the match of the current Input FIFO string of symbols; and also include means to pipeline its results to the Encoder Unit. This Encode Unit serves to create a compact output codeword of variable-length, based on the relative representation of said modeling-output and the current state of the Modeling Unit, and also to pipeline its resulting output codeword to the Aligning Unit, that now transforms the variable-length output codeword into a byte-bounded output codeword and deliver it to an Output FIFO. The Output FIFO stores temporarily the byte-bounded codeword until they reach the output bus-size specified; and as result accomplishing the a compression process from an input block of uncompressed data onto a compressed bit-stream appearing at the output bus of the Output-FIFO.

According to one of the embodiments of this invention, the Modeling Unit includes updating means for the insertion in the Trie-Dictionary both preliminary and final updates derived from the of current string of symbols to the current state of the high-order dictionary, expressed by the Trie-Dictionary, and where the preliminary information is written in advance by the Modeling Unit to accelerate the overall procedure in case a final update coincide with said preliminary update; and hence avoiding the final update step.

It is also possible for the Modeling Unit to include updating means for parallel updating in the Literal-Dictionary the effect of current single symbol located on top of the Input FIFO, taking place if the Literal-Dictionary is not able to find any previous granted code for the symbol on top of the Input FIFO and the Trie-Dictionary is not able to find any internal or terminal nodes in the Trie-Dictionary that matches the multiple-symbol string currently contained in the Input FIFO.

The Modeling Unit can also include updating means for parallel updating of the prefix of the codeword used by the Encoder Unit, and the prefixes are updated based on the internal state of the Modeling Unit and the counters of the different types of codewords transferred Modeling Unit to the Encoder Unit.

An additional feature consists when both the Modeling Unit and the Encoding Unit include means for encoding output codewords in highly compact form, by using in the Modeling Unit storage means represented by internal registers, that keep track of the last previous internal node used in the Trie-Dictionary, and transferring as output codeword of the Encoder Unit 7 difference between the last previous internal node used and the current node number.

All the Modeling Unit, the Encoding Unit, the Aligning Unit and the Output FIFO can also comprise means to coordinate their parallel operation on different and independent codewords, creating a pipeline beginning on the Modeling Unit, where these parallel means allow to register in each of s the Modeling Unit, the Encoding Unit, the Aligning Unit and the Output FIFO the corresponding output codewords and transfer the codeword to the next unit in the compression chain during the next pipeline step. This is done as to avoid stalling for the operation of the Modeling Unit during the compression process.

In one of the embodiments of the decompression apparatus for decompression of blocks of digital data in a data compression system, the apparatus comprises means for buffering input codewords in a first-in first-out manner (Input FIFO), where these codewords constitute a variable-length encoding of the original fixed-length symbols. A Trie-Dictionary and a Literal Dictionary are connected to a Modeling Unit, where the Trie-Dictionary is composed by a multitude of memory location. The Modeling Unit is connected through an Output-FIFO to an Interface Unit, an Input FIFO and to an Aligning Unit, and the Aligning Unit is connected to a Decoder Unit. The Aligning Unit reorganizes the information received in byte-boundaries from said Input FIFO to its variable-length codeword representation and transfer it to the Decoder Unit, that receives the variable-length codewords and determines the correct bit-length of the prefix, node number, type and relative match-length of the node existing in the Trie-Dictionary described by the codeword or, alternatively, the correct bit length of the prefix and relative symbol code in the Literal Dictionary. The Decoder Unit include means for interacting with the Modeling Unit and determining on the basis of the latter internal registers and state of the Trie-Dictionary, the correct node number and absolute match-length represented by said input codeword. Alternatively, if the input codeword belongs to one of the literal types, the Modeling Unit reconstructs the original symbol with the help of the Literal Dictionary. Now, if the input codeword was of a node type, the Modeling Unit obtains from the content of the node accessed the correct position of the first symbol and the length of a copy operation and the Modeling Unit executes a Multi-Byte copy operation from earlier occurrence of the symbol or string of symbols from the determined position of the Output FIFO to the current position in Output FIFO. The Output FIFO serves to store temporarily the decoded original symbols until they reach an specified output bus-size (for example, words of 32 bits) and in a convenient output-write operation the results of the decompression process can be deliver over the Interface Unit to the output memory.

In one of the variants of the invention, the Modeling Unit contains means for updating in the Trie-Dictionary, in a preliminary and a final update stages, the effect of current string of symbols pointed by the Position counter in the Output FIFO, to the current state of Trie-Dictionary. According to this procedure, a preliminary update is written in advance by the Modeling Unit to the Trie-Dictionary, and it accelerates the overall procedure for the case when the final update coincide with the preliminary update, as in this case the final update step is avoided.

Also possible for the Modeling Unit in this is to include means for parallel updating in the Literal Dictionary the effect, when necessary, of current single symbol pointed by the Output FIFO. This update is accomplished when the Modeling Unit determines that no internal or terminal node in the Trie-Dictionary is used by the current codeword provided by the Decoder Unit, as it is the case for a New Literal NLIT codeword.

Besides, it is possible for the Modeling Unit also to include means for parallel updating of the prefix of the codeword used by the Decoder Unit, where the prefix updated by the Decoder Unit is based on the internal state of the Modeling Unit and the number of different codeword transferred by Modeling Unit to Decoder Unit. The Decoder Unit employs a balanced-tree of pair of codewords to grant the shortest prefix to the most frequently used type of codeword.

Finally, it is also possible for the Input FIFO, the Aligning Unit, the Decoding Unit, and the Modeling Unit to coordinate its parallel functioning on different and independent codewords, creating a pipeline starting at the Modeling Unit. This parallelism is achieved by registering in each of the Input FIFO, the Aligning Unit, the Decoding Unit, and the Modeling Unit the corresponding output of each block codeword and transferring the codeword to the next block (in the decompression chain) during the next pipeline step. These pipeline steps serve in as to avoid stalling in the operation of the Modeling Unit during the decompression process.

According to the present invention, the procedure for converting a block of input symbols into an output of codified variable-lengths codewords in a data-block compression system will consist in transferring the input symbols into the Input FIFO and then, calculate a multitude of hash addresses based on the contents of the first two symbols on top of the Input FIFO. These addresses will be used to search in parallel form in a Zero Look-Up Table and in a Trie-Dictionary, to quickly determine the existence of any internal or terminal node in the Trie-Dictionary. If the search in the Trie-Dictionary is able to find an internal node which produces a non-single match with the string of symbols represented in the Input FIFO, a multiple-byte search is iterated until the longest-match of the Input FIFO string of input symbols is found with respect to existing internal nodes of the Trie-Dictionary. The result is a codeword, identified as either internal (NODE) or terminal (LEAF), that is encoded in relative form, where the information about the node number is relative with respect to the last node created, match-length is encoded in differential form, referential to the earlier most recently visited node during the search. Alternatively, if the search in the Trie-Dictionary is not able to find an internal node which produces a non-single match with the string of symbols represented in the Input FIFO, it is determined now via the Literal Dictionary if the codeword to use is a Known Literal KLIT, identified by the variable-length code granted in an earlier occurrence of such symbol, when exist; or if it will be identified as a New Literal (NLIT) and reflected in its original byte-form, in case that it have been never registered in the Literal Dictionary before. Each type of codeword receives a variable-length prefix according to the type of codeword employed and this prefix will be determined via a balanced tree weighted on the basis of the specific cumulative counts of each codeword type. The resulting variable-length codeword will be now converted into a byte-bounded output result by means of a aligning operation and the output-bounded codewords will be stored into an Output FIFO, where they are grouped to produce an efficient write operation to the final storage means, in the sense of both timing arbitration and bus-width. As result, it will be generated from an uncompressed block of input symbols a compressed representation in a the form of a block of output codewords by means of a compression procedure.

It is advantageous when both the Trie-Dictionary and the Literal are updated dynamically, and there are additional steps for updating the Trie-Dictionary and the Literal Dictionary. A data structure is created in the form a Trie-Dictionary where both internal and terminal nodes coexist and grow in the same dictionary at the same time, the terminal nodes starting from 1 and growing up and the internal nodes starting from the maximum node number and growing down; and based on the updating procedure it is guaranteed that they will not collide. When a non-single match is found between the input string of symbols located in the Input FIFO and a node (internal or terminal) in the Trie-Dictionary, but the length do not coincide with any existing internal node, the steps comprise updating the Trie-Dictionary by creating a new internal node (NODE), decreasing the internal node counter, creating a new terminal node (LEAF) that receives as its depth the maximum block-length of the string starting on the first symbol for the specific block position; and finally, the step of increasing the terminal node counter. Alternatively, when a non-single match is found between the input string of symbols located in the Input FIFO and a node (internal or terminal) in the Trie-Dictionary, and the length coincide exactly with the length of an existing node, the steps comprise updating the reached node by updating on its Position Field the current Position Pointer in the Input FIFO and, additionally if the node is not a terminal node(LEAF), a new terminal node (LEAF) is created, receiving in its Position Field the current Position Pointer in the Input FIFO, and incrementing the terminal node counter in one. Another alternative appear when a match is not is found between the input string of symbols located in the Input FIFO and any node (internal or terminal) in the Trie-Dictionary, the update in this case comprising the steps of creating a new terminal node(LEAF), that receives the maximum length possible for that string within the remaining block, and also updating the Literal Dictionary, in case the input symbol located on top of the Input FIFO is not contained in Literal Dictionary, by assigning to the corresponding symbol entry a value equal to the cumulative number of known symbols received within the block of input symbols and flagging that symbol as Known literal in the Literal Dictionary and, finally, incrementing the counter of known symbols.

In one of the object of the invention a procedure for decoding the original block of data from an encoded block of codewords is accomplished by entering the word-aligned codeword into the Input FIFO, where they are converted to byte-aligned codewords and delivered to a de-aligning step that reconstructs said codewords into its variable-length size. At the input to the decoder, these codewords are classified, based on the dynamic prefix existing in the codeword, in one of the following types:

New Literal (NLIT)
Known Literal (KLIT)
Internal Node (NODE)
Terminal Node (LEAF)

If the codeword is identified as New Literal (NLIT), a single symbol is comprised in the codeword, that is delivered in its byte-form to the Output FIFO. Alternatively, if the codeword is identified as Known Literal (KLIT), a single symbol is reconstructed from the codeword via the Literal Dictionary and delivered to the Output FIFO. Otherwise, if the codeword type is either an internal node (NODE) or a terminal node (LEAF) in the Trie-Dictionary, a read is done in Trie-Dictionary to determine the father node of the decoded node, also determining the early block-position in which a similar string exists in the Output FIFO; the information of the depth of the node is transferred back onto the decoder, to allow the decoder to calculate the number of bits employed, and the value itself, of the relative length contained in the codeword; where this relative length is added to the father node-length reaching an absolute match-length; therefore conforming the parameters for executing a long-copy procedure, comprising one or more steps of copying to the Output FIFO from the position described by the position field of the decoded node as many symbols as determined by the absolute match-length of the copy. The above steps are iterated until there are no more codewords to decode and thus restoring the original block of input symbols from the compressed block of codewords.

It is also possible to use dynamic dictionaries in the decompression process for both Trie-Dictionary and Literal Dictionary where additional steps are included for updating Trie-Dictionary and the Literal Dictionary.

If a codeword is extracted that corresponds to a single symbol to be transferred to the Output FIFO, the update of the Trie-Dictionary is reached by creating a new terminal node (LEAF), acquiring in its position field the current position pointer in the Input FIFO, and acquiring as its depth the maximum value allowed to the string within the block according to the block-position; and increasing by one the terminal node counter. Also it is checked if the decoded symbol is not already contained in the Literal Dictionary, and when the symbol does not exist in the Literal Dictionary, an update is done in the Literal Dictionary by assigning to the symbol in its corresponding entry the cumulative number of known symbols received so far in the block; and finally, incrementing by one the counter of known symbols in the block.

If a codeword is extracted that corresponds to an internal or terminal node in the Trie-Dictionary but the absolute match-length, calculated as the sum of said codeword-length and the father node's depth is not exactly said node depth itself, then the Trie-Dictionary is updated by creating a new terminal node (LEAF) which acquires in its position field the current Position Pointer in the Input FIFO and as its depth the maximum value allowed to that string within the block, the counter of terminal nodes is increased by one; and a new internal node (NODE) is created which acquires in its position field the current Position Pointer in the Input FIFO and as depth the absolute symbol match-length calculated by the decoding process, followed by decreasing by one the counter of internal nodes;

When a codeword is extracted that corresponds to an internal or terminal node in the Trie-Dictionary and the absolute match-length, calculated as the sum of said codeword length and the father node's depth, does exactly match the node depth itself, then the Trie-Dictionary is updated by creating a new terminal node (LEAF) which acquires in its position field the current Position Pointer in the Input FIFO, and as its depth the maximal value allowed to that string according to the block-position, followed by increasing by one the counter of terminal nodes.

There are different embodiments of the procedure referring to the forms in which the prefixes are updated. In case of using dynamic prefixing, during compression and decompression the prefixes are updated for the codeword types. The prefixes can be updated whenever any of the pair members counters [Known Literal KLIT, leaf node LEAF] and [New Literal NLIT, internal node NODE] will be greater compared with the other counter of the pair, granting to said member that owns the greater counter the shorter codification available to the pair, and repeating the comparison between the counters of the pair leaders; therefore re-balancing the prefix tree in order to produce the shorter prefix to the most frequently used codeword type.

It is possible to define the following starting values for the prefixes as: New Literal=>0(1 bit), Known Literal=>10(2 bits), Terminal Node=>110(3 bits), Internal Node=>111(3 bits) in the case where prefixes will be modified dynamically; otherwise, for the static prefixes heuristic the starting values for the prefixes could be defined as: New Literal=>0(1 bit), Known Literal=>10(2 bits), Terminal Node=>110(3 bits), Internal Node=>111(3 bits), and remain static during the compression and decompression processes.

The block data compression system object of the invention will be employ two dictionaries. The first dictionary will be a prefixed trie-dictionary, composed by internal nodes (or NODES) and terminal nodes(or LEAVES). The second dictionary will be a Literal Dictionary, that copes with individual symbols with not encoded by the first dictionary. During compression, a search is made in a Zero Look-Up Table to determine if there is a match of the current sub-string, on top of the Input FIFO, with one of the available branches of the trie-dictionary. If a match is found then, via a massive read and a speculative update, the branch is traversed-down with the use of a multi-byte parallel comparison engine, traveling down through all matching internal nodes and down to a LEAF node expressing the maximum length of the match beginning with the current sub-string.

On the contrary, if a match of the current sub-string is not found in the trie-dictionary, then the encoding result will be determined by the content of the Literal dictionary. It can then be either the literal itself, if the individual symbol is new (non-existing previously) to that literal dictionary; or the code granted by this literal dictionary, if the individual symbol have been seen before within the block, in such a way optimizing the encoding of reduced-alphabets data streams.

As a result of the process described, four types of codeword will be generated by the modeling unit during compression. The codeword New Literal (NLIT) will include individual symbols non-existing in the prior input data stream; the codeword Known Literal (KLIT) will include individual symbols already founded in the prior input data stream but whose associated sub-string failed to match with the branches of the trie-dictionary; the codeword Internal 1Node (NODE) describes sub-strings matches with a trie-dictionary branch which ends in an internal node and; the codeword Leaf Nodes (LEAF) which describes sub-string matches with a trie-dictionary branch which ends is a terminal node.

These codewords are prefixed with the help of a dynamic prefixing balanced-tree, which will be added to the codewords. Codewords that are used frequently will receive the highest priority (and the shorter prefix), thus achieving a higher correspondence with the learning process of substitutive methods. At the same time, smaller codewords will be reached in the initial stages of the compression; and in general, better adaptability to several types of data in the bounded space required by block compression. The encoder stage of the compressor is pipelined in such a manner, as to accomplish its operation during the time the model stage update its dictionaries. The encoder stage maps near-optimally the dictionary information obtained by using high contextual code representations, based on the existing synchronic state of the dictionaries. As result, the Encoder stage will provide a variable-length codeword output.

The aligning stage of the compressor is composed also by a pipelined structure and works in parallel with the model and encoder stages. It employs a high-speed procedure to align the variable-length codewords received from the encoder to the byte-boundaries required for final output.

Final results of the compressor are temporarily stored in a first-in first-out (FIFO) memory allowing to organize bus-conscious word transfers to the external memory and minimize the output bandwidth required.

BRIEF DESCRIPTION OF THE DRAWINGS

The Block-Data compression system preferred embodiment of the present invention will be illustrated below, with the help of the following diagrams showing:

FIG. 2 the data structures implemented by the preferred embodiment of the current invention on the Trie-Dictionary.

FIG. 3 depicts a self-balanced tree applied for prefixing the output entities used by the preferred embodiment of the present invention.

FIG. 5 an implementation example of the Compression algorithm for an input string, FIG. 6 the Trie-Suffix Tree after procedure described in FIG. 5

DETAILED DESCRIPTION OF THE INVENTION

The objects of this invention are a block data compression apparatus and method performing a block data compression with Multi-Byte search. The invention is presented in FIG. 1, showing the block diagram of the preferred embodiment of the apparatus, as a non-restrictive example of implementation of a device that accomplish the data compression and decompression, according to the procedure described, also object of the invention.

Figure 1:
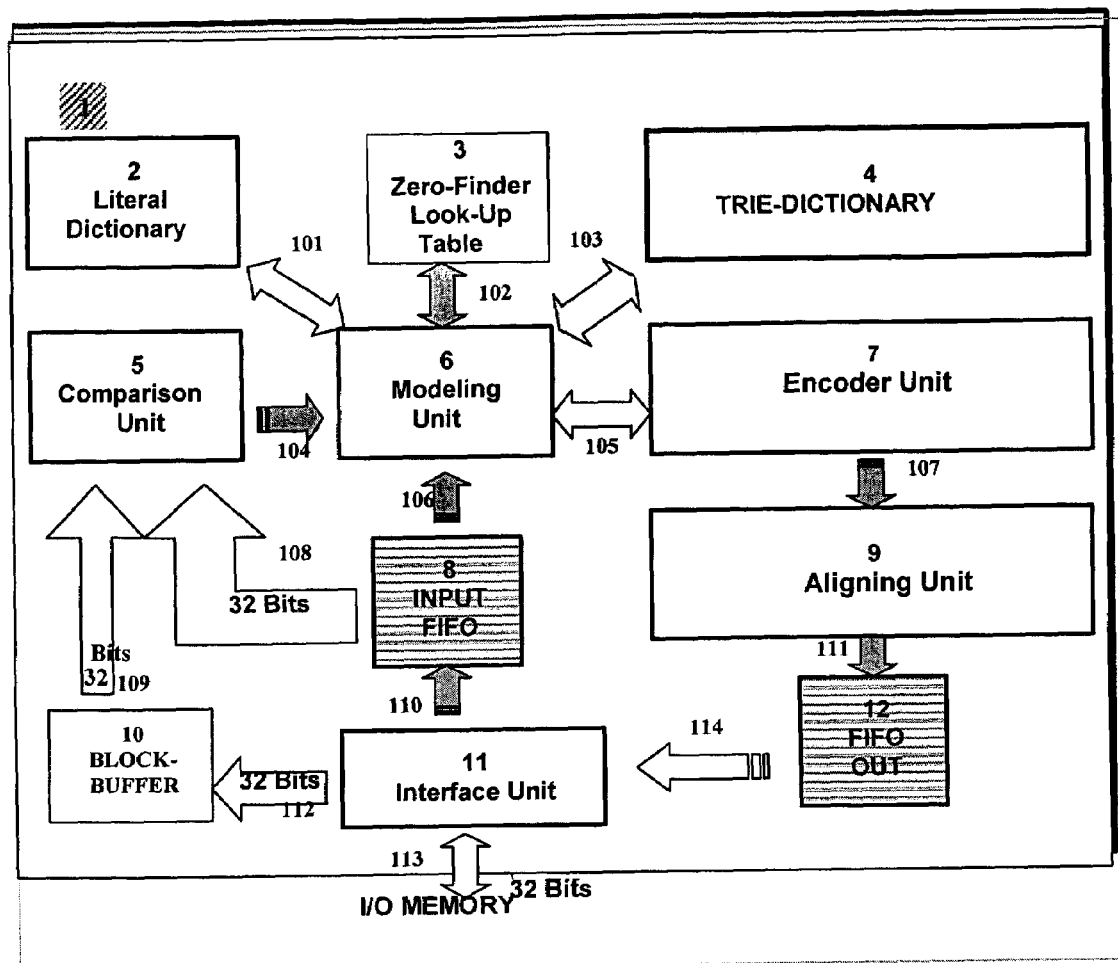
FIG. 1 a block diagram of the Compression Unit.

The system described in FIG. 1 shows a block diagram of the preferred embodiment of this invention, that could be hardware or software implemented, without restrictions whatsoever, by means of discrete integrated circuits, a FPGA or any associated digital design technology, which could be the basis for development of ASIC devices.

There is a Compression Unit 1, composed by a Trie-Dictionary 4, comprising a high-order dictionary and there is also a Literal-Dictionary 2 comprising the low-order dictionary. In principle, the compression unit can be separated physically from the Dictionary Memory 4, but in the preferred embodiment of this invention they are they are implemented together in a single hardware design due to the advantages of using the wide bus 103 for accessing long memory-records at once. The Trie-Dictionary 4 is accessed via a Memory Interface 103, that handles all the electrical and timing related details of the signals that will be used to access the Trie-Dictionary 4. While in the broader embodiment of the present invention the Dictionary Memory 4 should be considered as a RAM memory, particular implementations could also use ROM memories, provided that in this case the ROM-Dictionaries are created in advance and pre-programmed.

A detailed description of the data structure employed in the Trie-Dictionary 4 is illustrated in FIG. 2. Every entry is organized in the form of a long record, where each record have the following fields: Father 210(12-bits), Position 211(12-bits), Count 212(8-bits), New 213(8-bits), Node 214(12-bits), where in brackets we have indicated exemplarily the number of bits per field used as in the preferred embodiment, in which the maximal internal block size is selected as 4 Kilobytes. The number of bits required scales as the block size varies in one or another direction.

A unique property of this Trie-Dictionary 4, is that it contains at the same time both internal nodes (referred hereinafter as NODE) and leaves nodes (referred hereinafter as LEAF), the NODES being numbered from 1 and up, while the LEAF nodes being numbered from the maximum size (0×0fff for block size equal to 4 Kilobytes) and down. The construction rules employed in the creation and updating of the Trie-Dictionary 4 prevent any collision among these two types of nodes, while substantial advantages in memory requirements are reached by this construction compared with existing previous art.

For every record in the Trie-Dictionary 4 the description of the fields stored are as follow, as depicted in FIG. 2: the Position Field 211 contains the address of the starting point of the string of symbols described by the node, i.e. their location in the original block; the Father Field 210 indicates either the preceding node in the top-down search of the Trie-Dictionary 4 that is visited when reaching the specific node, if it exists, or the first symbol of the string that originated the string described by the node (e.g. 'a' on substring 'abcd'), conveniently differentiated one case from the other by means of a flag in high-order bit; the New field 213 store the symbol that indicates the route from the Father node to the specific node, i.e. the branch that was taken starting from the Father node to reach given node (e.g. New='c' in the transition from father Node representing 'ab' to the Node representing 'abc'); the Count field 212 indicates the depth of the match of the strings of symbols generating given node; a Node field 214, specifying the Node number within the Trie-Dictionary 4.

The data flow that takes place during compression in the system is depicted in by FIG. 1 and described in the following. First, the input data is read via the I/O Memory Bus 113 into the Input-FIFO 8, capable to store in the preferred embodiment at least 64 bytes. Then the two symbols heading-out the Input-FIFO 8 are used to generate a hash function that provides an address to both the Zero-Finder Look-Up Table 3 and in the Dictionary Memory 4. This address is used to detect if there is a node within the content of the Dictionary Memory 4 that could represent an string with similar starting symbols as the string currently analyzed. If the Zero-Finder Look-Up Table 3 resulting bit, obtained by means of the Zero-Finder LUT bus 102, confirms that this address is not empty, then a Read-Write Operation is started by the Modeling Unit 6 on the specific hash-calculated address using the Memory Interface 103. As a result of this Read-Write operation, the validity of the hash is confirmed, receiving from the Node field 214 the Node number and all the pertinent information concerning this node. The obtained information includes the previous existence of the most recently visited string of symbols containing the same starting pair and the Depth of the previously founded match in Count field 212.

Once that the hash validity is verified, by means of a matching of both Father field 210 and New field 213 with the par of symbols heading the current substring, a Read-Compare cycle is initiated and the Comparison Unit 5 is fetched with the symbols following the checked pair in the Input FIFO 8 using the FIFO-Comparison bus 108, and from the other side with the data read via the Buffer Comparison bus 109 from the Block Buffer 10 in the position indicated by the Position field 211 of the valid node found.

In the apparatus described as the preferred embodiment, 4-bytes are compared simultaneously in the Comparison Unit 5, and hence, by iterating the Compare cycle and providing the results via the Comparison Results Bus 104 to the Modeling Unit 6, long matching strings can be quickly traveled until a mismatch is found or until specified depth, defined by the Count field 212 of the node, is reached. As a result of the steps discussed above, the Modeling Unit 6 obtains the maximum length of coincidence of current string of symbols located in the top of the Input FIFO 8 with existing dictionary contents. Now the Modeling Unit 6 sends a pair [relative node, relative displacement] to the Encoder Unit 7. The [relative node] will be calculated as the difference between the last created node in the dictionary and the one that was obtained from the Node field 214. In a similar way, the [relative displacement] will be calculated as the difference between the current match-length and the match-length of the father Node.

Still, if during the procedure described before, the Hash verification fails as a result of a mismatch between either the Father field 210 or the New field 213 of the accessed node, compared to the current register values, then, the Modeling Unit 6 either generate a new hash address and repeat the search in the Trie-Dictionary 4 or, based on the hash-look-forward information extracted from the Zero-Finder Look-Up Table 3, conclude the search in said Trie-Dictionary 4. For that latter case, when the Zero-Finder Look-Up Table 3 early detects the lack of an existing Node in the Trie-Dictionary 4 for the initial hash of the two first symbols in the Input FIFO 8 area, then a Literal encoding type is used. The single symbol is then used for addressing via the Literal-bus 101 the Literal-Dictionary Unit 2, and obtaining from the read operation via Literal-bus 101 the indication if the first symbol in the FIFO 8 has ever been seen in the stream processed. If the answer to that inquiry, coming from Literal-Dictionary Unit 2, is positive (represented by a one in the high-significant bit of the result), then the literal encoding granted to that symbol on its first appearance, being this value received simultaneously via Literal-bus 101. By granting a variable number of bits for the literal encoding of the single symbols, where the number of bits is proportional to the alphabet size of the encoded stream, the encoding of the symbols is shortened in comparison with the case when the symbols are transferred to the output in its original form.

If the specific literal returns a zero via Literal-bus 101 in the most significant bit (MSB) from the Literal-Dictionary Unit 2, then it means that is had never seen before in the processed block. As consequence that literal is transmitted in its original form to the Encoder Unit 7, and the Literal-Dictionary Unit 2 is then updated in the Read-Write cycle currently ongoing in Literal-bus 101, granting to this symbol the corresponding Known Literal encoding, which is then incremented by one, and setting the MSB with the value of one.

As a result of the above described operations, four types of encoding can be generated from the Modeling Unit 6 to the Encoder Unit 7:

New Literal (NLIT)
Known Literal (KLIT)
Internal Node (NODE)
Leaf Node (LEAF)

The first two types of encoding correspond to a single-symbol encoding, while the last two types correspond to a multiple-symbol encoding, expressed through the Trie-Dictionary 4 contents. Since the number of entities generated by the Modeling Unit 6 is higher than in any existing prior art, traditional tagging techniques are useless and furthermore, special measures have to be considered to keep optimal the length of the prefixing.

FIG. 3 shows the balanced weighted-tree used to reach a dynamic-prefixing heuristic. Prefixes are separated into two Groups (I and II), said Group I 302 comprising the NLIT encoding 304 and the LEAF encoding 305, while group II 303 comprises the encoding of KLIT 306 and NODE 307. Each type of encoding has an incremental counter, and at the beginning of the compression of the data block all counters are set to zero.

FIG. 3A shows additionally a predefined initial encoding for each of the entities, where NLIT has the shortest code (1 bit)[0], followed by KLIT (2 bits)[10] and LEAF and NODE having 3 bits [110 and 111, respectively]. Once the compression process starts, for every new encoded entity transferred to the Encoder, their correspondent counter will be incremented and again weighted against its pair in the group, and as soon as the right-member (Counter of LEAF nodes 305 or Counter of NODE nodes 307 in FIG. 3A) becomes greater than the left-member in a group(Counter of NLIT nodes 305 or Counter of KLIT nodes 307, respectively), it interchanges its encoding length and prefix with the other pair member in the corresponding group. The leader from each Group will now be compared at the group level and the shorter code, will be given to the group that has the highest counter, while the other group receives the second shortest (2-bits) encoding for the leader of that Group.

A clearer understanding of the heuristic involved can be reached with the help of the complementary diagram of FIG. 3B, where each coding type receives a quadrant in a clockwise rotated Priority Circle 308. While at the beginning of the data block the probability of finding new literal(NLIT) is much higher (for the first symbol, 100%) than any other encoding, the NLIT encoding receives the shorter prefix. As soon as the alphabet of the input start repeating itself (but not yet the pairs of symbols of the Trie-Dictionary 4), the code types rotate clockwise and the KLIT gets the higher priority.

In the meantime, the Trie-Dictionary 4 becomes more and more populated. When the number of LEAF nodes found become higher than the Counter of KLIT Codes 306, the circle rotates again, giving the highest priority to the appearance of a LEAF entity as the next codeword. Eventually a point is reached when, if the data is homogeneous enough, the Trie-Dictionary 4 will be able to express most of the input data with the help of internal Nodes, and the corresponding NODE prefix will get the shortest number of bits.

We recall the fact that the FIG. 3B is only used for clarifying purposes, and the real behavior of FIG. 3A is somewhat different to the described in the clarification above, but still it is useful to better understanding of the nature of the heuristic involved.

The advantage of the dynamic-prefix procedure described over prior art, is that it allows to reach relatively high compression rates for very small blocks, or equivalently, from the beginning of the larger data blocks. While so far we had explained the compression process, assuming that the dictionaries are somehow updated, we will concentrate our attention now in the updating process of the dictionaries, that takes place when a self-adapting dynamic scheme (with the use of Read-Write memories) takes place, as in the preferred embodiment.

Returning to the data flow during compression of FIG. 1, as part of the compression steps, the Trie-Dictionary 4 is updated by the Modeling Unit 6 to reflect the changes introduced by the processed symbol or string of symbols. First, a new LEAF is created in all cases, expressing the unique string headed by the first symbol at the top of the Input FIFO 8. After that, the LEAF node counter will be decremented by one.

If the encoding type was determined as a Literal, then the Father of this new Leaf is the symbol at the top of the Input FIFO 8. On the contrary, if a branch was found for at least two symbols heading the Input FIFO 8, then the Father field 210 of the new Leaf to create acquires the Node number of the last traversed Node in the Trie-Dictionary 4. Additionally, if during the matching-search procedure traversing through a Trie-Dictionary 4 branch the target Node depth is not reached, then a new internal Node is created, characterizing the common part of at least two existing strings into the Trie-Dictionary 4, and the new Leaf node is created as a branch from the just-created internal node of type NODE.

It worth to notice that, while separating the updating procedure from the compression for explanation purposes, characteristic of this invention is that the update in the Trie-Dictionary 4 is executed at the same time during the Read-Write Cycle to the address specified by last Hash candidate calculated by the Modeling Unit 6. Since the first write is executed before final knowledge about the length of the matching is known by the Modeling Unit 6, then the visited node is updated in its Position field 211 and a default Leaf candidate is written in advance, as an speed-up mechanism that we refer as Advanced Speculative Updating (ASU). This default Leaf is created on the assumption that the search in the Trie-Dictionary 4 will fail and the single current symbol will be the father of that Leaf, and correspondingly written in the Father field 210. If eventually this assumption proves to be incorrect, a rewrite cycle is organized for that LEAF, but on a new time slot inside the additional cycles added proportional to the new symbols added. The effect of that ASU is a reduced and balanced state diagram for the compression Modeling Unit 6, augmenting the performance of the preferred embodiment of this invention.

A similar speculative technique, in parallel with the above-mentioned one, is applied to the update of the Literal-Dictionary 2. If a new literal is identified by the Zero-Finder Look-Up Table 3 of FIG. 1, then this speculative updating of the Literal-Dictionary 2 will take place, written preliminarily a newly assigned Index for that specific input symbol. Once the Modeling Unit 6 finalizes the processing of a certain substring in the input stream of symbols, a new codeword is transferred to the Input Encoder Bus 105 with the reference information found onto the Encoder Unit 7 of FIG. 1. The task of the Encoder Unit 7 is to convert this information into a bit-stream capable of being understand by the decompressing unit later on, while using the maximum relative number of references to the actual state of all dictionaries and pointers currently used by the compression, as far as they have to be the synchronically re-created by the decompression.

Bit operations accomplished by the Encoder Unit 7 are mostly direct logic transformation and hence require no iterations, as required by the overall speed system requirements of the compression procedure.

To reach these purposes, the Encoder Unit 7 employs the following rules and the corresponding means for implementing them in the apparatus:

If a LEAF codeword is to be encoded, the Leaf Number is expressed relative to the current Leaf Counter, by using a growing prefix scheme that increments the number of bits from 0 as to allow room for the maximum possible length (Starting Leaf-Current Leaf) to be expressed. The length of the symbol match, or dictionary-match distance, is also expressed not in absolute form, but referred to the Father of the Leaf Node, while unary codification of the integer, highly skewed in favor of shorter codes are appended to the Leaf encoding.

If a NODE codeword is to be encoded, the node number is first constricted to the maximum number of bits required by $\log_2$(NodeCounter) and eventually modified if sparse codes are possible within this bit length. Same procedure is applied to the dictionary match distance, where it is calculated based on the distance with respect to its Father node, according to the maximum number of bits potentially necessary to express this distance and using sparse codes if would that be the case.

If a Known Literal KLIT is to be transmitted, its index is instead transferred to the Encoder, with a length according to the $\log_2$(LitCounter), eventually using sparse codes if possible.

And finally, the New Literal NLIT, that is always transferred in its original representation.

As result of this encoding procedure, the variable-length encoding is transferred by means of the Input bus of the Aligner 107 into the Aligning Unit 9 of FIG. 1, while the Encoder Unit 7 releases itself in order to attend the next encoding cycle generated by the Modeling Unit 6, that had been running in parallel during the last cycle(s), processing the next symbols in the Input FIFO 8. The function of the Aligning Unit 7 is to convert these binary chains of encoded bits into byte-bounded pieces that can be handled by the Output FIFO 12. For this purpose, the Aligning Unit 7 include means for appending the new bit-encoding stream, generated to the particular codeword, to the remaining previous bit stream, concatenating its bit-representation. Additionally, there is functional block consisting of a matrix-shifting for shifting and adding a certain number of bits the new bit-stream, in order to get as result a multiplicity of aligned bytes and a new bit-remainder ready for the next aligning operation.

These output bytes are then transferred by means of the Output-FIFO Bus 111 in the Output FIFO 12 where they are stored, said Output FIFO 12 then waits until the output bus width is reached and generates a request (typically a DMA request as in the preferred embodiment) in the Output-Bus of the Output FIFO 114, optimizing in such a way the overall bandwidth of the system where the data compression apparatus is located.

There are some telecommunication applications, where small pieces of data comes alternatively form different sources, and therefore belonging to different contexts, as is it the case in a router handling several virtual channels, that should be considered as special cases.

Due to the highly synchronic nature of the compression described in this invention, and the advantages in compression rates when only homogeneous information is composing a data block, it commonly more convenient to process these separated virtual channels as different contexts with separated dictionaries.

For this purpose, in an alternative embodiment of the present invention, additional memory is allowed as to store the different contexts in the Trie-Dictionary 4 by means of the Memory Interface 103. An uploading/downloading mechanism to/from a host memory is created for the internal state registers of all the pertinent units, as well as the contents of all internal dictionaries.

Figure 4:
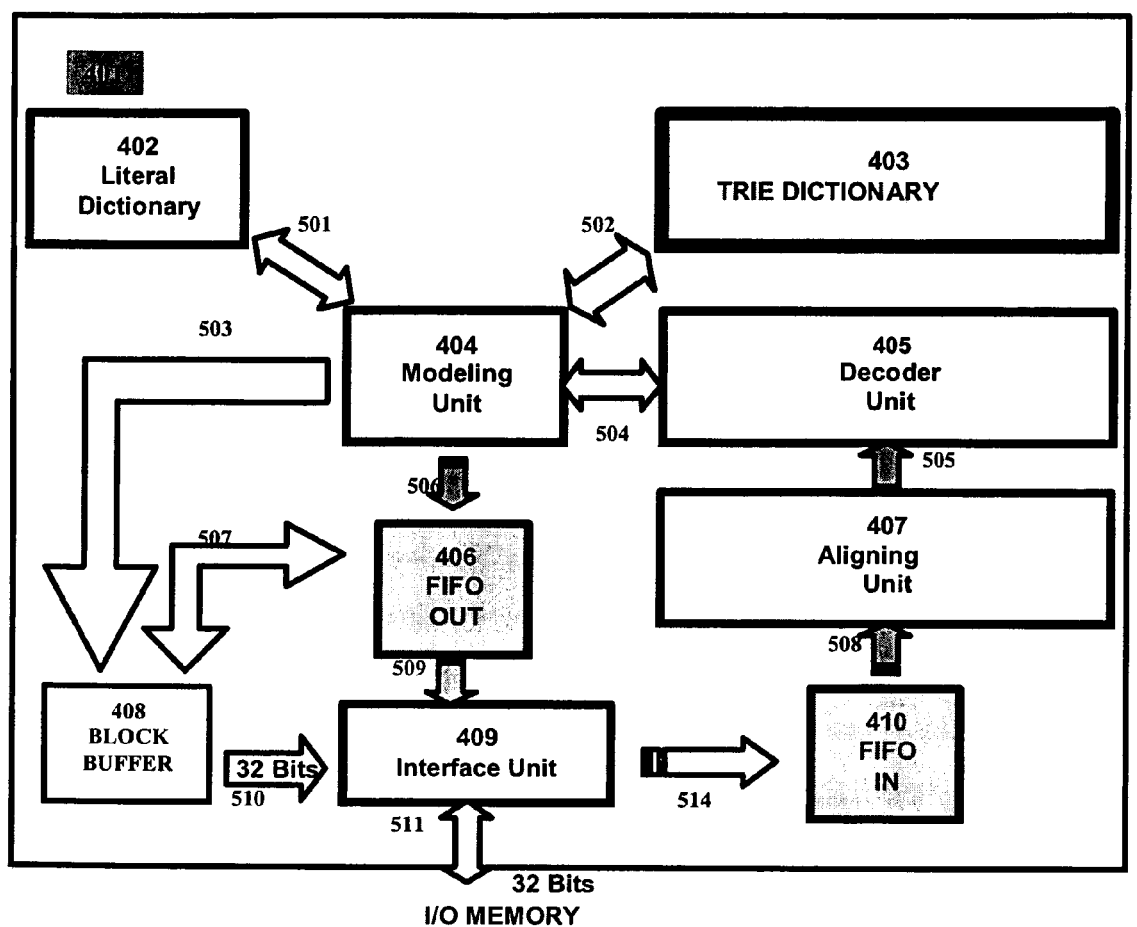
FIG. 4 a block diagram of the Decompression Unit.

Since the decompression process represent the exact opposite of the described method, we shall shortly refer to it by describing the data flow that occur in the FIG. 4.

First, encoded data is fetch to the Input FIFO 410 using the Input Bus of the Aligner Unit 508, said Input-FIFO working in the other direction (it was physically Output-FIFO during compression) by reading from the I/O Memory as many bytes as required to keep full this FIFO. Data arriving at this Input FIFO 410 is then transferred to the Aligning Unit 407, where it restores the proper bit meaning and order of the variable-length codewords represented, in a close interaction with the Decoder Unit 405, which assumes the tasks associated with the determination of the length of all the fragment involved in the specific codeword; based on the current value of the state registers shared by the Decoder Unit 405 and the Modeling Unit 404.

Secondly, the Decoder Unit 405 examines the state of the balanced prefix-tree of FIG. 3A to determine which type of codeword should be decoded, and therefore, gathering information about the number and type of codeword fragments comprising it. Once these fragments are determined by the Decoder Unit 405, then the absolute values of the first segment, following the prefix, are restored; representing either a Node in the Trie-Dictionary 403, to be reconstructed symmetrically by the decoder; or a Literal encoding, eventually using the symmetrically created Literal Dictionary 402. Now this information is transferred back into the Modeling Unit 404 which accesses the proper dictionary to get the remaining information required by the Decoder Unit 405, and thus completing the codeword decoding. If the codeword type decoded is of the Literal type (KLIT or NLIT), there is no second fragment present, and the Modeling Unit 404 transfers the restored literal into both the Block Buffer 408 and the Output-FIFO 406 (now acting in reverse form as temporary storage for the decoding process). Otherwise, if a Node codeword type is determined (NODE or LEAF), then there exist a second fragment indicating the displacement with respect to the father node in the Trie-Dictionary 403, and the Decoding Unit 405 calculates the depth of the specific Node, one component obtained via the Modeling Unit Output-bus 504 and originated from count field of the father node extracted from the Modeling Unit 404; and a displacement component extracted from the codeword, coming from the Aligning Unit 407 via bus 505, to obtain an absolute depth in the branch representing the length of the matching sub-string. This depth in the Trie-Dictionary 403 is transferred back into the Modeling Unit 404 via bus 504. Now the Modeling Unit 404 executes a multi-byte copy (starting from the position of the string represented by the node of the Trie-Dictionary 403) from the Block Buffer 408 into the Output-FIFO 406; and in parallel flagging to write-back this new symbols from said Output-FIFO 406 into the new position(s) in the Block Buffer 408 on the next free cycle or cycles. As during the compression procedure, the Output-FIFO, now by means of the Output-FIFO 406, assumes the task of queuing the output symbols to form a bus-wide write-out operation into the I/O external memory, and handling via a DMA handshaking-protocol, the optimal timing interval aimed as to minimize the bandwidth required for transferring the output data to external memory.

In resumed form, a data compression system comprising an apparatus for compression and an apparatus for decompression is once more depicted, said compression apparatus comprising an Input FIFO 8, for buffering input symbols in a first-in first-out manner, said symbols connected to arbitration means represented by a Modeling Unit 6, said Modeling Unit 6 connected with a Trie-Dictionary 4, a Zero Look-Up Table 3, search components in the form of a Comparison Unit 5, a memory representing the Literal-Dictionary 2 and with an Encoder Unit 7. Said Encoder Unit 7 is connected, on its own, to an Output-FIFO 12 through an Aligner Unit 9. Said Trie-Dictionary 4 is comprised by multiplicity of storage locations, accessed in parallel form by the Modeling Unit 6 and represents the high-order dictionary addressed via a Hash-function based on the first symbols contained in the Input-FIFO 8, said Modeling Unit 6 connected to a Zero Look-Up Table 3 including means for advanced determination of the existence of a certain unused space in the high-order dictionary, said Modeling Unit 6 determining if the string existing in the Input FIFO 8 can be expressed by internal or terminal nodes of said dictionary, said Modeling Unit 6 connected also to search means represented by a Comparison Unit 5, said Comparison Unit 5 executing parallel comparisons of several symbols at once to provide information about the maximal length of matching between a matching internal node in said dictionary and the string of symbols contained in said Input FIFO 8; said Modeling Unit 6 also connected to storage means comprising a Literal-Dictionary 2 representing the low-order dictionary, said Literal-Dictionary 2 including means for determining the encoded form granted by said Modeling Unit 6 for unmatched symbols strings of length equal to one; said Modeling Unit 6 including means for deciding whether it will use the result of the parallel search in the Comparison Unit 5 or the result of the Literal-Dictionary 2 as the modeling output; said Modeling Unit 6 including means that allow to iterate the parallel search in the Comparison Unit 5 when more internal nodes of the dictionary are able to extend the match within the Input-FIFO 8 string of symbols; said Modeling Unit 6 including means to pipeline its results to encoder means represented by a Encoder Unit 7 that includes means to create a compact output codeword of variable length based on the relative representation of said modeling-output and the current state of the Modeling Unit 6, said Encoder Unit 7 connected to an Aligning Unit 9, said Encoder Unit 7 including means to pipeline said resulting output codeword to said Aligning Unit 9, said Aligning Unit 9 including means for converting the variable length output codeword into a byte-bounded output codeword, said Aligning Unit 9 connected to an Output FIFO 12 output memory buffer, said Output FIFO 12 including means for storing temporarily the byte-bounded codeword until they reach the output bus-size specified; and therefore accomplishing the conversion from an input block of uncompressed data into a compressed bit-stream, appearing at the Output-bus 114 of the output-FIFO 12, with the help of a compression process.

According to one of the embodiments of this invention, the Modeling Unit 6 also includes updating means for the insertion in the higher-order dictionary of both preliminary and final information of the effect of current string of symbols to the current state of said Trie-Dictionary 4, said string of symbols heading the Input FIFO 8; said preliminary information written in advance by said Modeling Unit 6 to speed up the overall procedure in case a final update coincide with said preliminary update and hence avoiding the final update step.

It is also possible for the Modeling Unit 6 to include updating means for parallel updating in the Literal-Dictionary 2 the effect of current single symbol heading the Input FIFO 8, said Literal-Dictionary 2 connected to said Modeling Unit, said updating taking place if the Literal-Dictionary 2 is not able to find any previous granted code for the symbol heading said Input FIFO 8 and the high-order dictionary is not able to find any internal nodes NODE in the Trie-Dictionary 4 matching the multiple-symbol string currently contained in said Input FIFO 8.

The Modeling Unit 6 can also include updating means for parallel updating of the prefix of the codeword used by the Encoder Unit 7, said Encoder Unit 7 connected to said Modeling Unit 6, said prefix updated by said Encoder Unit 7 based on the internal state of said Modeling Unit 6 and the number of different types of codewords transferred by said Modeling Unit 6 to said Encoder Unit 7.

An additional possibility consists when both the Modeling Unit 6 and Encoding Units 7 contain means for encoding output codewords in highly compact form, by using means of storage in the Modeling Unit 6 represented by internal registers that keep track of the last previous internal node used in the Trie-Dictionary 4; said output codeword transferred to said Encoder Unit 7 as the difference between said last previous internal node used and the current node number.

The Modeling Unit 6, Encoding Unit 7, the Aligning Unit 9 and the Output FIFO 12 can also comprise means to coordinate a parallel operation on different and independent codewords, creating a pipeline with respect to said Modeling Unit 6, said parallel means including means for registering in each of said units the corresponding output codewords and transferring said codeword to the next unit in the compression chain during the next pipeline step, said pipeline step organized in such a way as to minimize stalling for the Modeling Unit during the compression process.

In one of the embodiments of the decompression apparatus for decompression of blocks of digital data in a data compression system, said apparatus comprising means for buffering input codewords in a first-in first-out manner (Input FIFO 410), said codewords representing a variable length codification of the original fixed-length symbols; a Trie-Dictionary 403 and the Literal-Dictionary 402 connected to a Modeling Unit 404, and constitute the components for operating with the Trie-Dictionary 403, comprising a multitude of memory location; said Modeling Unit 404 connected through an Output-FIFO 406 to an Interface Unit 409, an Input FIFO 410 and to an Aligning Unit 407; said Aligning Unit 407 connected to a Decoder Unit 405. The Aligning Unit 407 reorganizes the information received in byte-boundaries from said Input FIFO 410 to its variable length codeword representation and transfer it to the Decoder Unit 405, said Decoder Unit 405 including means for receiving the variable-length codewords and also including means for determining the correct bit-length of the prefix, node number, type and relative match-length of the node existing in the Trie-Dictionary 403 described by the codeword or, alternatively, the correct bit length of the prefix and relative code in the Literal Dictionary 402; said Modeling Unit 404 comprising means for interacting with the Trie-Dictionary 403 representing the high-order dictionary and determining on the basis of its internal registers and state of the Trie-Dictionary 403 the correct node number and absolute match-length represented by said input codeword; said Modeling Unit 404 reconstructing the original symbol with the help of the Literal-Dictionary 402, if the codeword belongs to one of the literal types; said Modeling Unit 404 obtaining from the content of the node accessed the correct position of the first symbol and the length of a copy operation; said Modeling Unit 404 containing means to execute a Multi-byte copy operation from earlier occurrence of the symbol or string of symbols in said determined position of the Output FIFO 410 to the current position in said Output FIFO 410, said Output FIFO 410 storing temporarily the decoded original symbols until they reach the output bus-size specified and the convenient output timing arbitration to deliver over the Interface Unit 409 the results of the decompression process to the output memory.

In this embodiment of the invention, the Modeling Unit 404 contains means for insertion in the Trie-Dictionary 403 both preliminary and final updates of the effect of current string of symbols to the current state of said Trie-Dictionary 403, said string of symbols pointed by the Position Field on the Output FIFO 410; said preliminary update written in advance by said Modeling Unit 404 to the Trie-Dictionary 403 to accelerate the overall procedure in case said final update coincide with said preliminary update; hence avoiding the final update steps.

It is also possible for the Modeling Unit 404 to include means for parallel updating in the Literal Dictionary 402 the effect, if necessary, of current single symbol pointed by the Output FIFO 410, said Literal Dictionary 402 update taking place if the Modeling Unit 404 determines that no internal node in the Trie-Dictionary 403 is used by the current codeword provided by the Decoder Unit 405, as it is the case for a New Literal NLIT codeword.

Besides, it is possible for the Modeling Unit 404 also to include means for parallel updating of the prefix of the codeword used by the Decoder Unit 405, said prefix updated by said Decoder Unit 405 based on the internal state of said Modeling Unit 404 and the number of different codeword transferred by said Modeling Unit 404 to said Decoder Unit 405, said Decoder Unit 405 employing a balanced tree of pair of codewords to grant the shortest prefix to the most frequently used type of codeword.

Finally, it is also possible for the Input FIFO 410, the Aligning Unit 407, the Decoding Unit 405, and the Modeling Unit 404 to include means to coordinate its parallel functioning on different and independent codewords, creating a pipeline with starting at the Modeling Unit 404, said parallel means consisting on means for registering in each of the Input FIFO 410, the Aligning Unit 407, the Decoding Unit 405, and the Modeling Unit 404 the corresponding output of each block codeword and transferring said codeword to the next block in the decompression chain during the next pipeline step, said pipeline steps organized in such a way as to avoid stalling for the Modeling Unit 404 during the decompression process.

Finally, In FIG. 5 and FIG. 6 a practical example of the compression procedure executed by the apparatus described is shown, in specific, in the procedure for compressing the input string "abcabbcaacbcbcaacx"

There is an input string and the position for every of the symbols involved, starting from 0. We had assumed empties dictionaries, for both the Trie-Dictionary 4 and Literal-Dictionary 2, as the starting condition (the default condition for the preferred embodiment). In FIG. 5 an step by step description of the compression process is depicted, while in FIG. 6 an equivalent diagram of the Trie-Dictionary 4 reflecting the processed symbols is also reflected.

First, starting symbols 'a' [at position 0 ] and 'b'[1] are hashed to determine if an string starting with 'ab' exists in the Trie-Dictionary 4. While the Trie-Dictionary 4 reports a failure, and a search of 'a' in the Literal Dictionary 2 indicates that there had not been founded before, is classified as NLIT, and transmitted in original form [H61], prefixed by a '0' bit. Meanwhile, terminal node I is created and the 'a' gets the codeword 0 in the Literal Dictionary 2. Same procedure is repeated for 'b'[1] and 'c'[2] as no match are found for these starting symbols in the Trie-Dictionary 4.

For the string abb . . . starting at [3], however, a match is found with I and so it is compared with those at [0], determining that the match length is just 2 symbols. In this case, a LEAF codeword is constructed, describing I as the target node (2 terminal nodes back from the current) and 2 symbols as the match. The update of the trie is done by creating first the internal node 1, with a depth of 2, updating the father of I as 1, and creating the new terminal node IV. Same procedure is applied to string bcaa . . . at [5], which finds a match with node II (2 terminal nodes back) and a match of 3 symbols; at the same time the Trie-Dictionary 4 is updated by creating nodes 2 at depth 3 and V.

Pair a,c at [8] does not find a Trie-Dictionary 4 match. However, symbol a is already known by the Literal Dictionary, and the codeword KLIT,0 is sent to the decoder. Again, same applies to c[9], encoded as KLIT,2, on the impossibility to find a match to string 'cb . . . ' in the Trie-Dictionary 4.

The pair b,c at [10,11] finds a trie-match with internal node 2, referencing to [5], but the match falls short to reach the depth of 3 represented by this node, and therefore, a codeword NODE 2 is transmitted out, together with a match of 1 more than the father. As the father in this case is the symbol b itself with a depth of 1, and furthermore, the NODE codeword only applies for matches 2 or above, then only one bit is used to express the specific match of 2, with a value of 0 (a value of 1 would had mean instead a match of 3, i.e. the node 2 depth itself).

As next step, string bcaacx [12] is analyzed. First, the search in the Trie-Dictionary 4 passed through the steps of finding node 3, and reaching its depth of 2; then node 2, and also reaching its depth of 3; and then reaching the node V, and finishing the search at a depth of 5. A codeword of LEAF (−3,2) is generated in this case, as the distance with respect to the current terminal node and difference in depth with father of V (node 2).

The example ends by codifying x[17] as a NLIT and transferring "0",[H78] to the Aligning Unit.

Note that the short example illustrated do not generate a re-balancing of the prefix-tree and it uses the same starting values for all codeword involved.

Also the procedure for converting a block of input symbols into an output of codified variable-lengths codewords in a data-block compression system should be clarified, said procedure initiated by transferring the input symbols into the Input FIFO 8 and then calculating a multitude of hash addresses based on the contents of the first two symbols heading the Input FIFO 8 and using these addresses to search in a Zero Look-Up Table 3 to quickly determine the existence of any internal/terminal node in the Trie-dictionary 4. When a search in the Trie-dictionary 4 is able to find an internal node NODE or leave node LEAF which produces a non-single match with the string of symbols represented in the Input FIFO 8, then a multiple-byte search is iterated until the longest match of the Input FIFO 8 string of input symbols is found with respect to existing internal nodes in the Trie-dictionary 4, and the process will be repeated until no more matching nodes are found. The node number will be encoded in relatively to the last node created, and identifying the codeword as either internal NODE or terminal LEAF in the Trie-dictionary 4. The length of the match will be transferred to the encoder in differential form referential to the earlier most recently visited node during that search. When a search in the Trie-dictionary 4 is not able to find an internal node which produces a non-single match with the string of symbols represented in the Input FIFO 8, it will be determined via the Literal Dictionary 2 if a codeword Known Literal KLIT can be used, identified by the variable-length code granted in an earlier occurrence of such symbol; or if the codeword will be a New Literal NLIT and the symbol reflected in original form, in case it have been never registered in the Literal Dictionary 2 before. To each type of codeword a variable-length prefix will be assigned whereas this prefix will be determined via a balanced tree-weighted on the basis of the current weight of the cumulative count of the codeword type, producing as result a variable length codeword that will be transformed into a byte-bounded output result by means of an aligning operation; and storing the byte-bounded codewords into the OUTPUT FIFO 12, where they are grouped to produce an efficient write operation to the final storage means, both in the sense of timing and bus-width, in such a way generating from an uncompressed block of input symbols a compressed representation in a the form of a block of output codewords.

It is advantageous when dynamic dictionaries are used for both the Trie-dictionary 4 and the Literal Dictionary 2 and when additional steps are accomplished to update the Trie-dictionary 4 and the Literal Dictionary 2. It is reached by creating a data structure in the Trie-dictionary 4 where both internal nodes NODE and terminal nodes LEAF coexist and grow in the same dictionary at the same time, the internal nodes starting from 1 and up and the terminal nodes starting from top and down, and based on the updating procedures it is guaranteed that they will not collide. When a non-single match is found between the input string of symbols located in the Input FIFO 8 and the Trie-dictionary 4, but the length do not coincide with any existing internal node; the updating steps comprising the step of creating a new internal node NODE, the step of decreasing the internal node NODE counter, the step of creating a new terminal node LEAF, said new LEAF node acquiring as its depth the maximum length of the string beginning by the first symbol in the specific block position, and finally, the updating step of incrementing in one the terminal node counter. When a non-single match is found between the input string of symbols located in the Input FIFO 8 and the Trie-dictionary 4, and the length coincide exactly with an existing internal node NODE or terminal node LEAF; the updating steps comprising the step of updating said reached node, said reached node acquiring in its Position field the current position address in the Input FIFO 8, and additionally the step, if the node is not a terminal node LEAF, of creating a new terminal node LEAF, said new terminal node acquiring in its Position field the current Position Pointer in the Input FIFO 8, and finally, the step of increasing the terminal node LEAF counter. When a match is not found between the input string of symbols located in the Input FIFO 8 and any node the Trie-dictionary 4, the updating steps comprising the steps of creating a new terminal node LEAF in said dictionary, said new terminal node acquiring the maximum length possible for that string within the remaining block; and additionally, in case the input symbol located in the front of the Input FIFO 8 is not contained in the Literal Dictionary 2, the steps of updating the Literal Dictionary 2 by assigning to the symbol entry a number corresponding the cumulative amount of new symbols received within the block of input symbols, the step of flagging that symbol as Known Literal in said Literal Dictionary 2 and the step of incrementing in one the counter of Known Literal symbols.

In a typical embodiment of the procedure for decoding the original block of data from an encoded block of codewords, the steps of entering the byte-aligned codewords into the Input FIFO 410, said Input FIFO 410 transferring said codewords into a de-aligning step that reconvert said codewords into its variable-length size providing them as an input to the decoder step, where said codewords are classified, based on the dynamic prefix existing in said codeword, in one of the following types: New Literal NLIT, Known Literal KLIT, Internal Node NODE, Terminal Node LEAF. According to the procedure, when the codeword is identified as New Literal NLIT and therefore, a single symbol is contained in the codeword, which and delivered directly to the Output FIFO 406; when the codeword is identified as Known Literal KLIT, a single symbol is recovered from the codeword via the Literal Dictionary 402 and delivered to the Output FIFO 406; when the codeword type is either an internal node NODE or a terminal node LEAF in the Trie-Dictionary 403, the steps of reading from said Trie-Dictionary 403 the father node of said node, determining the early block position in which a similar string exists in the Output FIFO 406, and also providing the information of the depth of the node to the decoder, the step of said decoder calculating the number of bits employed in the relative length and the value itself of said relative length, the step where said relative length is added to said father node of said internal node and conforming the parameters for a multi-byte copy step to take place, said multi-byte copy step copying to the Output FIFO 406 starting from the position described by the position field of said internal node decoded, and copying as many symbols as determined by said absolute length of the copy. The above steps will be iterated until there are no more codewords to decode; and thus restoring the original block of symbols from the compressed block of codewords.

It is also possible to use dynamic dictionaries in the decompression process for both Trie-Dictionary 403 and Literal Dictionary 402 additionally comprising the steps of updating said dictionaries as follows: when a codeword is extracted corresponding to a single symbol to be transferred to the Output FIFO 406, comprising the steps of updating the Trie-Dictionary 403 by creating a new terminal node LEAF, said new terminal node LEAF acquiring in its position field the current position address in the Output FIFO 406, said new terminal node LEAF acquiring as its depth the maximum value allowed to the string within the block; the step of increasing by one the terminal node counter; and also the step of checking if the decoded symbol is not already contained in the Literal Dictionary 402. If that is the case, then adding the steps of updating the Literal Dictionary 402 by assigning to the symbol in its corresponding entry in the Literal Dictionary 402 the cumulative number of new symbols received so far in block, and the steps of incrementing by one the counter of Known symbols within the block.

If a codeword is extracted corresponding to an internal node NODE in the Trie-Dictionary 403 but the absolute match-length, calculated as the sum of said codeword length and the father node's depth does not exactly match said node depth itself, then the steps of updating the Trie-Dictionary 403 by creating a new terminal node LEAF, said new terminal node acquiring in its position field the current position address in the Output FIFO 406, said new terminal node acquiring as its depth the maximum value allowed to that string within the block; the step of increasing by one the counter of terminal nodes; the steps of creating a new internal node NODE, said new NODE acquiring in its position field the current position pointer in the Output FIFO 406, said new node acquiring as its depth the absolute symbol match-length calculated by the decoding process, and the step of decrementing by one the counter of internal nodes.

If a codeword is extracted corresponding to an internal node in the Trie-Dictionary 403 and the absolute match-length, calculated as the sum of said codeword length and the father node's depth does exactly match said node depth itself, then the steps of updating the high-order dictionary by creating a new terminal node LEAF, said new terminal node acquiring in its position field the current position address in the Output FIFO 406, said new terminal node acquiring as its depth the maximal value allowed to that string within the block and the step of increasing by one the counter of terminal nodes.

There are different embodiments of the procedures according to the update policy of the prefixes. When dynamic prefixing is used, then the prefixes of the codeword types are updated during compression and decompression. The updating of the prefixes will take place whenever any of the pair members [Known Literal KLIT, terminal node LEAF] and [New Literal NLIT, internal node NODE] surpass the cumulative weight compared with the other member of the pair, said member that surpass the cumulative weight acquiring the shorter codification available to the pair, said prefix tree rebalancing itself in order to gives the shorter prefix to the most frequently used codeword type.

In the preferred embodiment, the initial prefix-values are defined according to the following:

New Literal =>0 (1-bit)
Known Literal =>10 (2-bits)
Terminal Node =>110 (3-bits)
Internal Node =>111 (3-bits)

where said prefixes can be modified dynamically or can also remain static during the compression and decompression processes.

The invention claimed is:

1. A data compression system comprising a compression apparatus and a decompression apparatus with Multi-Byte search for fast compression of blocks of digital data comprising means for buffering input symbols in a first-in first-out manner (Input FIFO), said symbols connected to arbitration means represented by a Modeling Unit, said Modeling Unit connected to a Trie-Dictionary, to a Zero Look-Up Table, to search means represented by a Comparison Unit, to storage means in the form of a Literal Dictionary and to an Encoder Unit, said Encoder Unit connected through an Aligning Unit to an Output-FIFO, said Trie-Dictionary consisting in a memory massive with a multiplicity of storage locations comprising the Trie-Dictionary, accessed in parallel by said Modeling Unit, said Trie-Dictionary representing the high-order dictionary addressed via a hash function based on the first symbols in the Input FIFO, said Modeling Unit including means for advanced determination of the existence of a certain unused space in the high-order dictionary, said Modeling Unit determining if the string existing in the FIFO can be expressed by internal and terminal nodes of said Trie-Dictionary, said Search Engine executing parallel comparisons of several symbols at once to provide information about the maximal length of matching between a partially-matching internal node in said Trie-Dictionary and the string of symbols contained in said Input FIFO; said Literal Dictionary including means for determining the encoded form granted for unmatched symbols strings (of length equal to one);

said Modeling Unit including means for deciding whether it will use the result of the parallel search in the Comparison Unit or the result of the Literal Dictionary as the modeling output;

said Modeling Unit including means that permit iterating the parallel search in the Comparison Unit when more internal nodes of the dictionary extend the match within the Input FIFO string of symbols;

said Modeling Unit including means to pipeline its results to the Encoder Unit including means to create a compact output codeword of variable length based on the relative representation of said modeling-output and the current state of the Modeling Unit;

said Encoder Unit including means to pipeline said resulting output codeword to said Aligning Unit, said Aligning Unit including means for converting the variable length output codeword into a byte-bounded output codeword that is written into said Output FIFO, said Output FIFO including means for storing temporarily the byte-bounded codeword until the output bus-size specified and is reached the output timing arbitration to deliver the results of the compression process to the output memory is reached; and transforming a block of uncompressed digital data into a compressed data-stream that is transferred out by means of the Output-Bus of the Output FIFO.

2. The block data compression system of claim 1, where the Modeling Unit includes updating means comprising means for the insertion in the Trie-Dictionary of both preliminary and final information of the effect of current string of symbols to the current state of said Trie-Dictionary, said string of symbols located on the top of the Input FIFO;

said preliminary information written in advance by said Modeling Unit to speed up the overall procedure in case a final update coincide with said preliminary update thereby avoiding the final update step.

3. The block data compression system of claim 2, where the Modeling Unit includes updating means comprising:

means for parallel updating in the Literal Dictionary the effect of current single symbol on the top of the Input FIFO, said Literal Dictionary connected to said Modeling Unit, said updating taking place if the Literal Dictionary is not able to find previously granted code for the symbol on top of said Input FIFO and the Trie-Dictionary is not able to find internal node in the high-order dictionary matching the multiple-symbol string currently contained in said Input FIFO.

4. The block data compression system of claim 3, where the Modeling Unit includes updating means comprises:

means for parallel updating of the prefix of the codeword used by the Encoder Unit, said prefix updated by said Encoder Unit based on the internal state of said Modeling Unit and the number of different codeword that has previously been transferred by said Modeling Unit to said Encoder Unit.

5. The block data compression system of claim 4, wherein the inclusion in the Modeling Unit and in the Encoding Unit of means for encoding output codewords, by using means of storage in the Modeling Unit represented by internal registers that keep track of the last previous internal or terminal node used in the Trie-Dictionary, with a node output-codeword transferred to said Encoder Unit as a differential of said last previous internal node used and the current node number and a length-codeword based on the differential of the matches of said previous node and said current node.

6. The apparatus for block data compression of claim 5, where wherein the Modeling Unit, Encoding Unit, the Aligning Unit and the Output FIFO are further comprised means to coordinate parallel functioning on different and independent codewords, creating a pipeline with starting point at said Modeling Unit, said parallel means including means for registering in each of said Modeling Unit, said Encoding Unit, said Aligning Unit and said Output FIFO the corresponding output each block codeword and transferring said codeword to the next block in the compression chain during the next pipeline step, said pipeline step minimizing stalling for the Modeling Unit during the compression process.

7. The data compression system of claim 1, including means for decompression of blocks of digital data comprising a Trie-Dictionary and a Literal Dictionary and means for buffering input codewords in a first-in first-out manner (Input FIFO), said codewords representing a variable-length coding of the original non-compressed fixed-length symbols;

where said Trie-Dictionary and Literal Dictionary are connected to a Modeling Unit, operating over a massively accessed random memory with a multiplicity of storage locations as represented by the Trie-Dictionary;

said Modeling Unit itself connected to an Output FIFO, an Interface Unit, an Input FIFO, an Aligning Unit and a Block Buffer, as well as directly to Decoder Unit; said Aligning Unit reorganizing the information received in byte-boundaries by said Input FIFO to a variable length codeword representation, that is transferred to the Decoder Unit, said Decoder Unit including means for receiving the variable-length codewords and including means for determining the correct bit-length of the prefix, node number, type and relative match-length of the node existing in the Trie-Dictionary described by the codeword or, conversely, the correct bit length of the prefix and relative code in the Literal Dictionary;

said Decoder Unit transferring the results to the Modeling Unit;

said Modeling Unit comprising means for interacting with the Trie-Dictionary representing the high-order dictionary and extracting the node or literal information, said Decoding Unit interacting with said Modeling Unit and determining, on the basis of the Modeling Unit internal registers and state of the Trie-Dictionary, the correct node number and absolute match length represented by said input codeword;

said Modeling Unit obtaining from the content of the node accessed the correct position of the first symbol and the length of the copy operation determined by either the Trie-Dictionary contents or the Literal Dictionary contents;

said Modeling Unit containing means to execute a Multi-byte copy operation from earlier occurrence of the symbol or string of symbols in said determined position of the Output FIFO to the current position in said Output FIFO;

said Output FIFO storing temporarily the decoded original symbols until the output bus-size specified is reached and the convenient output timing arbitration to deliver the results of the de-compression process to the output memory is reached.

8. The block data decompression system of claim 7 wherein the Modeling Unit block further comprises containing means for insertion in the Trie-Dictionary both preliminary and final updates of the effect of current string of symbols to the current state of said Trie-Dictionary, said string of symbols pointed by the Position Field in the Output FIFO;

said preliminary update written in advance by said Modeling Unit to the Trie-Dictionary to accelerate the overall procedure in case said final update coincide with said preliminary update;

thereby avoiding the final update steps.

9. The block data decompression system of claim 7, where the Modeling Unit also includes updating means comprising means for parallel updating in the Literal Dictionary the effect, of current single symbol on top of the Output FIFO, said updating operative if the Modeling Unit determines that no internal or terminal node in the Trie-Dictionary is used by the current codeword obtained by the Decoder Unit.

10. The block data decompression system of claim 7, where the Modeling Unit also includes updating means further comprises means for parallel updating of the prefix of the codeword used by the Decoder Unit, said prefix updated by said Decoder Unit based on the internal state of said Modeling Unit and the number of different codeword transferred by said Modeling Unit to said Decoder Unit, said Decoder Unit employing a balanced tree of pair of codewords, said tree granting the shortest prefix to the most frequently used type of codeword.

11. The block data decompression system of claim 7, where additionally the Input FIFO, the Aligning Unit, the Decoding Unit, and the Modeling Unit are further comprised
- means to coordinate its parallel functioning on different and independent codewords, creating a pipeline starting on said Modeling Unit;
- said parallel means including means for registering in each of Input FIFO, the Aligning Unit, the Decoding Unit, and the Modeling Unit, the corresponding output codeword and transferring said codeword to the next block in the decompression chain during the next pipeline step;
- said pipeline step avoiding stalling for the Modeling Unit during the decompression process.

12. A procedure for converting a block of input symbols into an output of codified variable-lengths codewords in a data-block compression system, comprising a Trie-Dictionary and a Literal Dictionary, including also input and output first-in first-out (FIFO) buffers, and a multiple-byte search mechanism, comprising
- transferring the input symbols into the Input FIFO;
- calculating a multitude of hash addresses based on the contents of the first two symbols on top of the Input FIFO and using these addresses to search in parallel in a Zero Look-Up Table and in the Trie-Dictionary, to determine the existence of internal NODE/terminal LEAF node in the high-order dictionary;
- operative when a search in the Trie-Dictionary is able to find an internal node which produces a non-single match with the string of symbols represented in the Input FIFO;
- iterating a multiple-byte search until the longest match of the Input FIFO string of input symbols is found with respect to existing internal nodes of the Trie-Dictionary;
- encoding in relative form the information about the node number founded with respect to the last node created, and identifying the codeword as either internal (NODE) or terminal (LEAF) in the Trie-Dictionary transferring the length of the match to the encoder in differential form and referential to the earlier most recently visited node during the search;
- operative when a search in the Trie-Dictionary is not able to find an internal node which produces a non-single match with the string of symbols represented in the Input FIFO;
- the code word determining via the Literal Dictionary if the codeword to use is a Known Literal KLIT and identified by the variable-length code granted in an earlier occurrence of said symbol, or if the codeword is identified as a New Literal (NLIT) and reflected in its original byte-form, if the case is the codeword never registered in the Literal Dictionary before;
- assigning to each type of codeword a variable-length prefix according to the type of codeword employed, whereas said prefix is determined via a balanced tree weighted on the basis of the specific cumulative counts of each codeword type;
- converting the resulting variable length codeword into a byte-bounded output result by an aligning operation;
- storing the output-bounded codewords into the Output FIFO, where the codewords are grouped to produce an efficient write operation to the final storage means, both in the sense of timing arbitration and bus-width;
- generating from an uncompressed block of input symbols a compressed representation in a form of a block of output codewords.

13. The procedure of claim 12 comprising applying dynamic dictionaries in both Trie-Dictionary and Literal Dictionary, and where additionally steps of updating the Trie-Dictionary and the Literal Dictionary consist of
- creating a data structure in the Trie-Dictionary where both internal and terminal nodes coexist and grow in the same dictionary at the same time, the terminal nodes starting from and growing up and the internal nodes starting from the maximum node number and growing down, and thereby preventing collision of said nodes;
- operative when a non-single match is found between the input string of symbols located in the Input FIFO and a node (internal or terminal) in the Trie-Dictionary, the length do not coincide with any existing internal node;
- comprising the steps of updating said dictionary by creating a new internal node (NODE), the step of decrementing the internal node counter, the step of creating a new terminal node (LEAF), said new terminal node acquiring as its depth the maximum block-length of the string starting the first symbol in the specific block position, and the step of increasing the terminal node counter;
- operative when a non-single match is found between the input string of symbols located in the Input FIFO and a node (internal or terminal) in the Trie-Dictionary, the length coincide with the length of an existing node;
- comprising the step of updating said reached node, said reached node acquiring in its Position Field the current Position Pointer in the Input FIFO; and
- operative if the node is not a terminal node (LEAF);
- the steps of creating a new terminal node (LEAF), said new terminal node acquiring in its Position Field the current Position Pointer in the Input FIFO, and the step of increasing the terminal node counter;
- operative when a match is not is found between the input string of symbols located in the Input FIFO and a node (internal or terminal) in the Trie-Dictionary, comprising the steps of creating a new terminal node (LEAF), said new terminal node acquiring the maximum length for said string within the remaining block;
- operative in case the input symbol located on top of the Input FIFO is not contained in the Literal Dictionary;
- the step of updating the Literal Dictionary by assigning to the corresponding symbol entry a value equal to the cumulative number of known symbols received within the block of input symbols, the step of flagging that symbol as Known literal in said Literal Dictionary and, the step of incrementing the counter of known symbols.

14. The procedure of claim 13 comprising
- decoding the original block of data from an encoded block of codewords, said procedure comprising the steps of entering the byte-aligned codewords into the Input FIFO, said Input FIFO transferring said codewords into a de-aligning step that reconstructs said codewords into its variable-length size and transfer them to the input to the decoder step, where said codewords are classified, based on the dynamic prefix existing in said codeword, in one of the following types:
- New Literal (NLIT)
- Known Literal (KLIT)
- Internal Node (NODE)
- Terminal Node (LEAF)
- operative when the codeword is identified as New Literal (NLIT) and a single symbol is comprised in the codeword, delivered in its byte-form to the Output FIFO;

operative when the codeword is identified as Known Literal (KLIT) and a single symbol is reconstructed from the codeword via the Literal Dictionary and delivered to the Output FIFO;

operative when the codeword type is either an internal node (NODE) or a terminal node (LEAF) in the Trie-Dictionary, including the step of reading from said Trie-Dictionary the father node of said node, the step of;

determining the early block position in which a similar string exists in the Output FIFO, the step of transferring back the information of the depth of the node to the decoder, the step of said decoder calculating the number of bits employed, and the value, of the relative length contained in the codeword, the step of adding said relative length to said father node length of said decoded node, deriving in the absolute match-length;

and conforming the parameters for the step of executing a long-copy procedure, said long-copy step comprising the one or more steps of copying to the Output FIFO from the position described by the position field of said decoded node as many symbols as determined by said absolute match-length of the copy;

iterating the above steps until there are no more codewords to decode;

thereby restoring the original block of input symbols from the compressed block of codewords.

15. The procedure of claim 14 comprising applying of dynamic dictionaries in the decompression process for both Trie-Dictionary and Literal Dictionary comprising the steps of updating said dictionaries;

operative when a codeword is extracted corresponding to a single symbol to be transferred to the Output FIFO, comprising the steps of updating the Trie-Dictionary by creating a new terminal node (LEAF), said new LEAF node acquiring in its position field the current position pointer in the Input FIFO, said new LEAF node acquiring as its depth the maximum value allowed to the string within the block at that block-position;

the step of increasing by one the terminal node counter;

and the step of checking if the decoded symbol is not already contained in the Literal Dictionary, operative when the symbol does not exist in said Literal Dictionary with the steps of updating the Literal Dictionary by assigning to the symbol in its corresponding entry the cumulative number of known symbols received so far in the block, and the steps of incrementing by one the counter known of symbols in the block;

operative when a codeword is extracted corresponding to an internal or terminal node in the Trie-Dictionary and the absolute match-length, calculated as the sum of said codeword length and the father node's depth, is not said node depth; and including the steps of updating the Trie-Dictionary by creating a new terminal node (LEAF), said new terminal node acquiring in its position field the current Position Pointer in the Input FIFO, said new terminal node acquiring as a depth the maximum value allowed to said string within the block;

the step of increasing by one the counter of terminal nodes; and the steps of creating a new internal node (NODE), said new node acquiring in a position field the current Position Pointer in the Input FIFO, and acquiring as a depth the absolute symbol match-length calculated by the decoding process; and the step of decreasing by one the counter of internal nodes;

operative when a codeword is extracted corresponding to an internal or terminal node in the Trie-Dictionary and the absolute match-length, calculated as the sum of said codeword length and the father node's depth, matches said node depth itself; comprising the steps of;

updating the Trie-Dictionary by creating a new terminal node (LEAF), said new terminal node acquiring in a position field the current Position Pointer in the Input FIFO, said new terminal node acquiring as a depth the maximal value allowed to that string according to the block-position; and the step of increasing by one the counter of terminal nodes.

16. The procedure of claim 15, comprising the use of dynamic prefixing, comprising both during compression and decompression, the steps of updating the prefixes for the codeword types the updating the prefixes when any of the pair members counters including Known Literal KLIT, leaf node LEAF and New Literal NLIT, internal node NODE are greater compared with the other counter of the pair, the step of granting to said member that owns the greater counter the shorter codification available to the pair, the step of repeating the comparison between the counters of the pair leaders, and the step of re-balancing the prefix tree in order to produce the shorter prefix to the most frequently used codeword type.

17. The procedure of claim 16, comprising defining the starting values for the prefixes as:

New Literal=>0 (1-bit)
Known Literal=>10 (2-bits)
Terminal Node=>110 (3-bits)
Internal Node=>111 (3-bits)

and where said prefixes are modified dynamically.

18. The procedure of claim 15, comprising defining the starting values for the prefixes, when said prefixes are applied statically, including:

New Literal=>0 (1-bit)
Known Literal=>10 (2-bits)
Terminal Node=>110 (3-bits)
Internal Node=>111 (3-bits)

and remain static during the compression and decompression processes.

* * * * *